(12) United States Patent
Lee et al.

(10) Patent No.: US 10,211,070 B2
(45) Date of Patent: Feb. 19, 2019

(54) SEMICONDUCTOR DEVICE AND METHOD FOR MANUFACTURING THE SAME

(71) Applicant: Samsung Electronics Co., Ltd., Suwon-si, Gyeonggi-do (KR)

(72) Inventors: Chanho Lee, Gwangmyeong-si (KR); Hyunsoo Chung, Hwaseong-si (KR); Hansung Ryu, Seoul (KR); InYoung Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/815,032

(22) Filed: Nov. 16, 2017

(65) Prior Publication Data

US 2018/0315620 A1 Nov. 1, 2018

(30) Foreign Application Priority Data

Apr. 28, 2017 (KR) .......................... 10-2017-0055493

(51) Int. Cl.
| | | |
|---|---|---|
| *H01L 21/50* | (2006.01) | |
| *H01L 23/48* | (2006.01) | |
| *H01L 23/00* | (2006.01) | |
| *H01L 23/58* | (2006.01) | |
| *H01L 23/373* | (2006.01) | |
| *H01L 21/48* | (2006.01) | |
| *H01L 21/02* | (2006.01) | |

(52) U.S. Cl.
CPC ........ *H01L 21/50* (2013.01); *H01L 21/02118* (2013.01); *H01L 21/486* (2013.01); *H01L 23/373* (2013.01); *H01L 23/481* (2013.01); *H01L 23/58* (2013.01); *H01L 24/02* (2013.01)

(58) Field of Classification Search
CPC . H01L 21/50; H01L 21/02118; H01L 21/486; H01L 23/373; H01L 24/02; H01L 23/481; H01L 23/58
See application file for complete search history.

(56) References Cited

U.S. PATENT DOCUMENTS

| | | | | |
|---|---|---|---|---|
| 6,731,007 | B1 * | 5/2004 | Saito ................. | H01L 21/76838 257/762 |
| 7,608,549 | B2 * | 10/2009 | Van Nooten .......... | C23C 16/045 257/E21.019 |
| 8,791,549 | B2 * | 7/2014 | Chen ................. | H01L 21/76898 257/621 |
| 8,952,543 | B2 * | 2/2015 | Lee ....................... | H01L 23/481 257/751 |
| 8,956,966 | B2 | 2/2015 | Lin et al. | |
| 8,963,292 | B2 | 2/2015 | Oliver et al. | |
| 9,236,349 | B2 | 1/2016 | Lee et al. | |
| 9,252,110 | B2 * | 2/2016 | Lo ........................... | H01L 24/05 |
| 9,362,223 | B2 | 6/2016 | Andry et al. | |

(Continued)

FOREIGN PATENT DOCUMENTS

KR 10-2014-0024674 A 3/2014

*Primary Examiner* — Karen Kusumakar
(74) *Attorney, Agent, or Firm* — Harness, Dickey & Pierce, P.L.C.

(57) ABSTRACT

A semiconductor device including a substrate, an insulating, layer on the substrate and including a trench, at least one via structure penetrating the substrate and protruding above a bottom surface of the trench, and a conductive structure surrounding the at least one via structure in the trench may be provided.

18 Claims, 17 Drawing Sheets

(56) References Cited

U.S. PATENT DOCUMENTS

| | | | |
|---|---|---|---|
| 9,397,038 B1 | 7/2016 | Uzoh et al. | |
| 9,449,913 B2 | 9/2016 | Lee et al. | |
| 2001/0019891 A1* | 9/2001 | Koh | C23C 16/02 438/687 |
| 2014/0048952 A1* | 2/2014 | Lee | H01L 23/5384 257/774 |
| 2017/0271283 A1* | 9/2017 | Lee | H01L 24/02 |

* cited by examiner

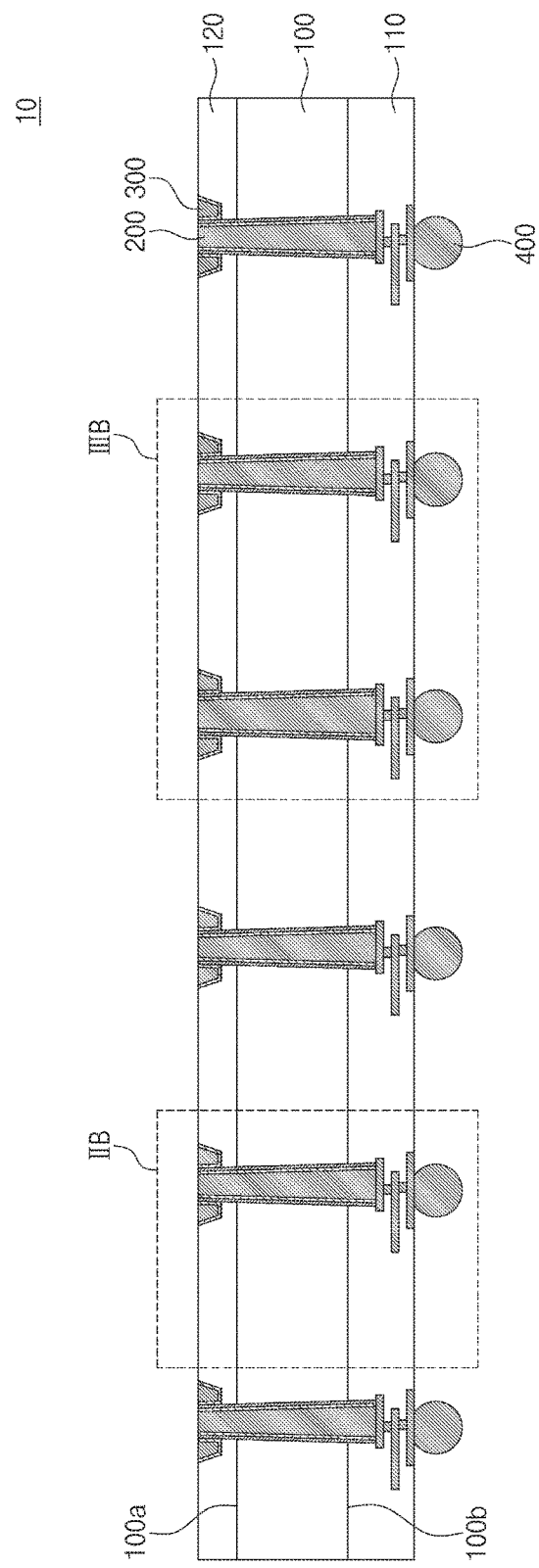

SEMICONDUCTOR DEVICE AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2017-0055493, filed on Apr. 28, 2017, in the Korean Intellectual Property Office, the disclosure of which is hereby incorporated by reference in its entirety.

BACKGROUND

Embodiments of the inventive concepts relate to semiconductor devices and/or methods for manufacturing the same and, more particularly, to semiconductor devices including a via structure and a pad structure and/or methods for manufacturing the same.

Techniques of stacking semiconductor devices have been developed to improve integration densities and performance of semiconductor products. For example, in a multi-chip package technique, a plurality of chips (or semiconductor devices) may be mounted in one semiconductor package. Further, in a system-in package technique, different kinds of chips (or semiconductor devices) may be stacked in one semiconductor package and operate as one system. When semiconductor devices are stacked, a method for improving a driving speed of the stacked semiconductor devices may be desired. A semiconductor device may be electrically connected to another semiconductor device or a printed circuit board through a conductive via. The conductive via may improve a transmitting speed of electrical signals. Reliable conductive vias have been being desired as semiconductor devices have been highly integrated.

SUMMARY

Some example embodiments of the inventive concepts may provide semiconductor devices with improved reliability and/or methods for manufacturing the same.

Some example embodiments of the inventive concepts may also provide methods for manufacturing a semiconductor device, which is capable of improving a yield.

According to an example embodiment of the inventive concepts, a semiconductor device includes a substrate, an insulating layer on the substrate, the insulating layer including a trench, at least one via structure penetrating the substrate and protruding above a bottom surface of the trench, and a conductive structure surrounding the at least one via structure in the trench.

According to an example embodiment of the inventive concepts, a semiconductor device includes a substrate, an insulating layer on the substrate, the insulating layer defining a trench, the insulating layer having a first top surface outside the trench, a second top surface at a bottom of the trench, and a third top surface connecting the first and second top surfaces, the trench extending from the first top surface of the insulating layer to a point vertically between the first top surface of the insulating layer and a bottom surface of the insulating layer, at least one conductive via structure penetrating the substrate and protruding above the bottom surface of the trench, and at least one conductive structure surrounding the at least one conductive via structure in the trench.

According to an example embodiment of the inventive concepts, a semiconductor device, when viewed in a plan view, includes a first metal structure including a first metal material, a barrier metal pattern surrounding the first metal structure, and a conductive structure surrounding the barrier metal pattern, the conductive structure including a second metal material, and an insulating layer surrounding the conductive structure.

According to an example embodiment of the inventive concepts, a method for manufacturing a semiconductor device includes forming a via structure penetrating through a first surface of a substrate toward a second surface of the substrate, the second surface being opposite to the first surface, thinning the substrate at the second surface thereof such that the via structure protrudes above an adjusted second surface of the substrate, forming an insulating layer on the adjusted second surface of the substrate, forming a trench in the insulating layer to surround a protruded portion of the via structure, providing a conductive layer on the adjusted second surface of the substrate and over the trench, planarizing the conductive layer, the via structure, and the insulating layer such that top surfaces of the conductive layer, the via structure, and the insulating layer are coplanar, and the conductive layer surrounds the via structure to form a conductive structure, and providing a semiconductor device employing the conductive structure.

BRIEF DESCRIPTION OF THE DRAWINGS

The inventive concepts will become more apparent in view of the attached drawings and accompanying detailed description.

FIG. 1 is a cross-sectional view illustrating a semiconductor device according to an example embodiment of the inventive concepts.

DETAILED DESCRIPTION

Figure 2A:
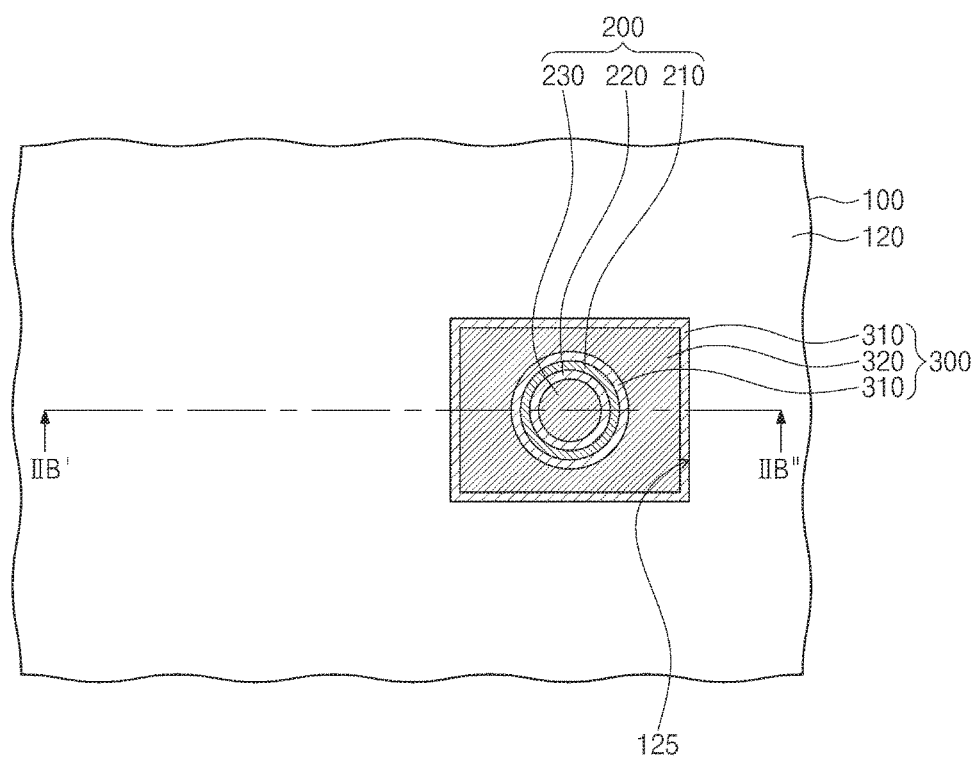
FIG. 2A is a plan view illustrating a semiconductor device according to an example embodiment of the inventive concepts.

Semiconductor devices according to some example embodiments of the inventive concepts will be described hereinafter in detail.

FIG. 1 is a cross-sectional view illustrating a semiconductor device according to an example embodiment of the inventive concepts.

Referring to FIG. 1, a semiconductor device 10 may include a substrate 100, a via structure 200, and a pad structure 300. The semiconductor device 10 may be a semiconductor chip including a memory chip, a logic chip, or a combination thereof. The substrate 100 may be a wafer-level or chip-level substrate. For example, the substrate 100 may include a semiconductor material such as silicon, germanium, or silicon-germanium. The substrate 100 may have a first surface 100a and a second surface 100b that are opposite to each other. The second surface 100b of the substrate 100 may be substantially parallel to the first surface 100a of the substrate 100. The first surface 100a of the substrate 100 may be a back surface. An insulating layer 120 may be disposed on the first surface 100a of the substrate 100. The pad structure 300 may be provided in the insulating layer 120. The second surface 100b of the substrate 100 may be a front surface. A circuit layer 110 may be provided on the second surface 100b of the substrate 100. Connection terminals 400 may be provided on a bottom surface of the circuit layer 110. The connection terminals 400 may include solder balls, bumps, pillars, or any combination thereof. The connection terminals 400 may include a conductive material. For example, the connection terminals 400 may include at least one of tin (Sn), lead (Ph), silver (Ag), or any alloy thereof.

The via structure 200 may be provided through the substrate 100, the insulating layer 120, and the pad structure 300. The via structure 200 may be electrically connected to the pad structure 300. The via structure 200 may be electrically connected to at least one of the connection terminals 400. In the present disclosure, it will be understood that when an element is referred to as being "electrically connected" to another element, it may be connected directly to the other element or one or more intervening elements may be present. Electrical signals may be transmitted from an external system to the semiconductor device 10 through the connection terminals 400 and the via structure 200 and/or may be transmitted from the semiconductor device 10 to the external system through the via structure 200 and the connection terminals 400. In the present disclosure, it will be understood that when an element, device, or system is referred to as being electrically connected to the semiconductor device, it may be electrically connected to at least one of transistors of the semiconductor device. The insulating layer 120, the via structure 200, and the pad structure 300 may be exposed at a top surface of the semiconductor device 10.

Figure 2B:
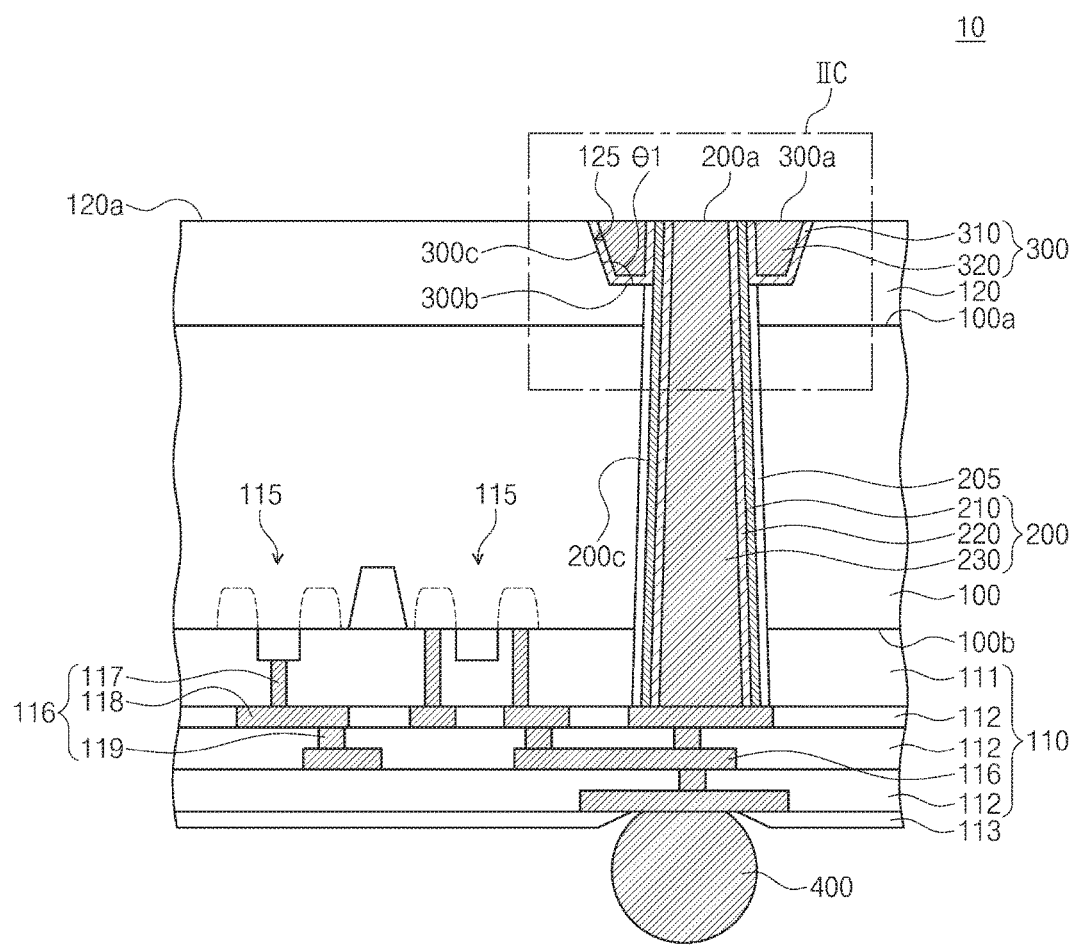
FIG. 2B is a cross-sectional view taken along a line IIB'-IIB" of FIG. 2A according to an example embodiment of the inventive concepts.
Figure 2C:
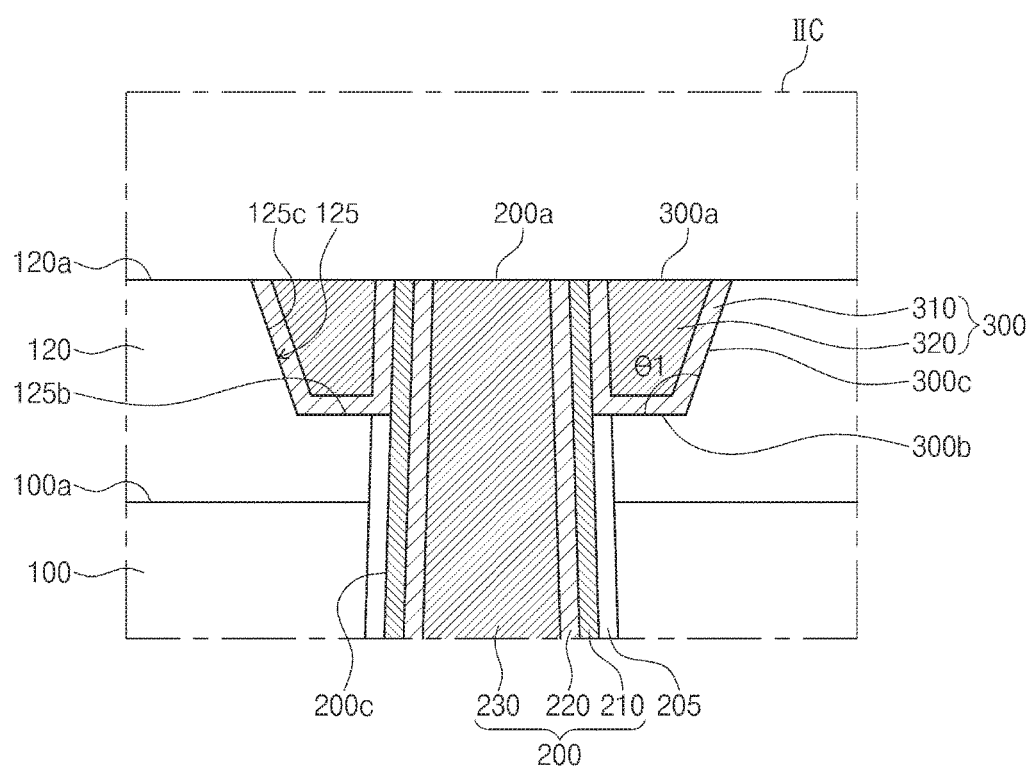
FIG. 2C is an enlarged view of a region IIC of FIG. 2B.

FIG. 2A is a plan view illustrating a semiconductor device according to an example embodiment of the inventive concepts. FIG. 2B is a cross-sectional view taken along a line IIB'-IIB" of FIG. 2A. Further, FIG. 2B corresponds to an enlarged view of a region IIB of FIG. 1. FIG. 2C is an enlarged view of a region IIC of FIG. 2B. Hereinafter, the descriptions to the same elements as in the above example embodiments will be omitted or mentioned briefly for the purpose of ease and convenience in explanation.

Referring to FIGS. 1, 2A, 2B, and 2C, the semiconductor device 10 may include the substrate 100, the circuit layer 110, the insulating layer 120, the via structure 200, and the pad structure 300. The circuit layer 110 may be provided on the second surface 100b of the substrate 100. The circuit layer 110 may include insulating patterns 111 and 112, transistors 115, and an interconnection structure 116. The transistors 115 may be formed on the second surface 100b of the substrate 100. A first insulating pattern 111 may be disposed on the second surface 100b of the substrate 100 and may cover the transistors 115. Second insulating patterns 112 may be disposed on the first insulating pattern 111. For example, the insulating patterns 111 and 112 may include at least one of silicon oxide, silicon nitride, or silicon oxynitride. The interconnection structure 116 may include a contact plug 117, an interconnection pattern 118, and an interconnection via 119. The interconnection structure 116 may include a conductive material (e.g., copper or tungsten). The contact plug 117 may penetrate the first insulating pattern 111 so as to be connected to the transistor 115. The interconnection pattern 118 may be provided between the insulating patterns 111 and 112. The interconnection via 119 may penetrate at least one of the second insulating patterns 112 so as to be connected to the interconnection pattern 118. The connection terminals 400 may be provided on the bottom surface of the circuit layer 110. At least one of the transistors 115 may be electrically connected to at least one of the connection terminals 400 through the interconnection structure 116. A protective layer 113 may be provided on the bottom surface of the circuit layer 110. The protective layer 113 may not cover the connection terminals 400. The protective layer 113 may include an insulating material (e.g., a polymer).

The insulating layer 120 may be provided on the first surface 100a of the substrate 100. The insulating layer 120 may have a trench 125. The trench 125 may extend from a top surface 120a of the insulating layer 120 toward a bottom surface of the insulating layer 120. The trench 125 may have a first width at a top surface thereof, and a second width at a bottom surface thereof such that the first width is greater than the second width. The insulating layer 120 may include an organic insulating layer. For example, the insulating layer 120 may include a polymer. The polymer may include a photosensitive polymer. The polymer may include a thermosetting polymer. The polymer may include at least one of photosensitive polyimide (PSPI), polybenzoxazole (PBO), or benzocyclobutene (BCB)-based polymer. The insulating layer 120 may include an organic material, and thus may be relatively soft. For example, the insulating layer 120 may be softer than at least one of the substrate 100, the pad structure 300, or the via structure 200. The insulating layer 120 may buffer or reduce stress applied to the pad structure 300 and the via structure 200. Warpage of the substrate 100 may occur in processes of manufacturing the semiconductor device 10. A thermal expansion coefficient of the insulating layer 120 may be different from a thermal expansion coefficient of the substrate 100. For example, the thermal expansion coefficient of the insulating layer 120 may be greater than the thermal expansion coefficient of the substrate 100. The warpage of the substrate 100 may be reduced or prevented by adjusting a thickness of the insulating layer 120. Hereinafter, the via structure 200 and the pad structure 300 will be described in detail.

The via structure 200 may penetrate the substrate 100, the insulating layer 120, and the pad structure 300. The via structure 200 may protrude from the first surface 100a of the substrate 100. An upper portion of a sidewall 200c of the via structure 200 may be surrounded by the pad structure 300. A lower portion of the sidewall 200c of the via structure 200 may be provided in the substrate 100. The via structure 200 may further penetrate the first insulating pattern 111. The via structure 200 may be electrically connected to at least one of the transistors 115 through the interconnection structure 116. Further, the via structure 200 may also be electrically connected to at least one of the connection terminals 400 through the interconnection structure 116.

A liner layer 205 may be interposed between the via structure 200 and the substrate 100 and between the via structure 200 and the insulating layer 120. The liner layer 205 may not extend between the via structure 200 and the pad structure 300. For example, the liner layer 205 may include an insulating material. The insulating material may include a silicon-based insulating material.

The via structure 200 may include a barrier pattern 210, a seed pattern 220, and a conductive via 230. The barrier pattern 210 may be disposed on the liner layer 205. The barrier pattern 210 may be provided along the sidewall 200c of the via structure 200. For example, the barrier pattern 210 may form the sidewall 200c of the via structure 200. The barrier pattern 210 may include at least one of titanium (Ti), titanium nitride (TiN), tantalum (Ta), or tantalum nitride (TaN). The seed pattern 220 may extend along the barrier pattern 210. The seed pattern 220 may include metal. The conductive via 230 may be disposed on the seed pattern 220. For example, the conductive via 230 may have a pillar shape, and the seed pattern 220 may be disposed between the barrier pattern 210 and a sidewall of the conductive via 230. The barrier pattern 210 may be disposed between the seed pattern 220 and the liner layer 205. The conductive via 230 may include metal (e.g., copper (Cu) or tungsten (W)). The barrier pattern 210, the seed pattern 220, and the conductive via 230 may be exposed at the top surface 120a of the insulating layer 120.

The pad structure 300 may be disposed on the first surface 100a of the substrate 100. As illustrated in FIG. 2A, the pad structure 300 may surround the via structure 200 when viewed in a plan view. A planar shape of the pad structure 300 may not be limited to a quadrilateral shape illustrated in FIG. 2A, but may be variously modified. The via structure 200 may penetrate the pad structure 300. The pad structure 300 may cover at least a portion of the sidewall 200c of the via structure 200. The pad structure 300 may be electrically connected to the via structure 200. The pad structure 300 may expose the via structure 200. For example, the pad structure 300 may expose a top surface 200a of the via structure 200. A top surface 300a of the pad structure 300 may be substantially coplanar with the top surface 200a of the via structure 200. For example, the top surface 300a of the pad structure 300 may be disposed at the same level as or substantially similar level to the top surface 200a of the via structure 200. In the present disclosure, the terms "the same level" and "coplanar" may take into account a tolerance range that may occur during a process.

The pad structure 300 may be provided in the insulating layer 120. For example, the pad structure 300 may be provided in the trench 125 of the insulating layer 120. For example, the pad structure 300 may be embedded in the insulating layer 120. The top surface 300a of the pad structure 300 may be substantially coplanar with the top surface 120a of the insulating layer 120. For example, the top surface 300a of the pad structure 300 may be disposed at the same level as or substantially similar level to the top surface 120a of the insulating layer 120. A bottom surface 300b of the pad structure 300 may be provided in the insulating layer 120. The insulating layer 120 may be in contact with a sidewall 300c of the pad structure 300 as well as the bottom surface 300b of the pad structure 300. Thus, a contact area between the pad structure 300 and the insulating layer 120 may be increased, thereby improving adhesive strength between the pad structure 300 and the insulating layer 120. Thus, a phenomenon that the pad structure 300 is separated from the insulating layer 120 may be reduced or prevented, thereby improving reliability of the semiconductor device 10.

An angle θ1 between the bottom surface 300b and the sidewall 300c of the pad structure 300 may be an obtuse angle. Thus, the contact area between the pad structure 300 and the insulating layer 120 may be further increased. If the angle θ1 between the bottom surface 300b and the sidewall 300c of the pad structure 300 is equal to or less than 90 degrees, stress may be concentrated in an edge or corner of the pad structure 300. Here, the edge or corner of the pad structure 300 refers to a region at which the bottom surface 300b of the pad structure 300 meets the sidewall 300c of the pad structure 300. The stress may include physical stress and/or stress caused by a difference between thermal expansion coefficients of the pad structure 300 and the insulating layer 120. At least one of the pad structure 300 or the insulating layer 120 may be damaged by the stress. For example, a crack may occur in at least one of the pad structure 300 or the insulating layer 120. However, according to some example embodiments of the inventive concepts, the angle θ1 between the bottom surface 300b and the sidewall 300c of the pad structure 300 may be greater than 90 degrees. Thus, the stress may not be concentrated in the edge or corner of the pad structure 300. Thus, reliability of the semiconductor device 10 may be improved. If the angle θ1 between the bottom surface 300b and the sidewall 300c of the pad structure 300 is to greater than 120 degrees, it may be difficult to form the pad structure 300. According to some example embodiments of the inventive concepts, the angle θ1 between the bottom surface 300b and the sidewall 300c of the pad structure 300 may be equal to or less than 120 degrees. For example, the angle θ1 between the bottom surface 300b and the sidewall 300c of the pad structure 300 may be greater than 90 degrees and equal to or less than 120 degrees.

The pad structure 300 may include a seed pad 310 and a conductive pad 320. As illustrated in FIG. 2C, the seed pad 310 may extend along a bottom surface 125b and a sidewall 125c of the trench 125 and an upper portion of the sidewall 200c of the via structure 200. The seed pad 310 may be in contact with the via structure 200 (e.g., the barrier pattern 210). The conductive pad 320 may be disposed on the seed pad 310. The conductive pad 320 may fill the trench 125. The conductive pad 320 may include metal (e.g., copper or aluminum). The topmost surface of the seed pad 310 and a top surface of the conductive pad 320 may be exposed at the top surface 120a of the insulating layer 120.

Figure 2D:
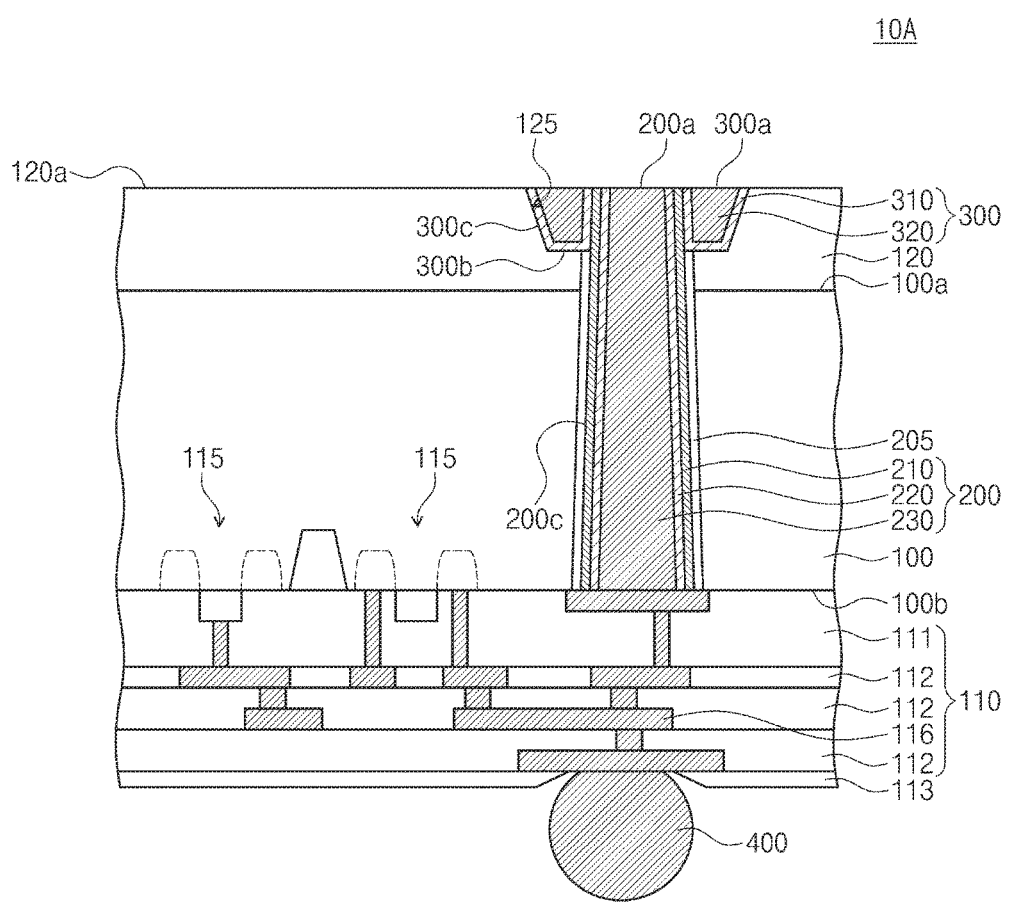
FIG. 2D is a cross-sectional view taken along the line IIB'-IIB" according to another example embodiment of the inventive concepts.

FIG. 2D is a cross-sectional view taken along the line IIB'-IIB" of FIG. 2A according to another example embodiment of the inventive concepts. Further, FIG. 2D is an enlarged view corresponding to the region IIB of FIG. 1. Hereinafter, the descriptions to the same elements as in the above example embodiments will be omitted or mentioned briefly for the purpose of ease and convenience in explanation.

Referring to FIGS. 1, 2A, and 2D, a semiconductor device 10A may include a substrate 100, a circuit layer 110, an insulating layer 120, a via structure 200, and a pad structure 300. The substrate 100, the circuit layer 110, the insulating layer 120, and the pad structure 300 of FIG. 2D may be the same as or substantially similar to those described above with reference to FIG. 2B. The via structure 200 of FIG. 2D may be the same as or substantially similar to those described with reference to FIG. 2B. For example, the via structure 200 may penetrate the substrate 100, the insulating layer 120, and the pad structure 300. However, the via structure 200 according to the present example embodiment may not be provided in the first insulating pattern 111 of the circuit layer 110, unlike FIG. 2B.

Figure 3A:
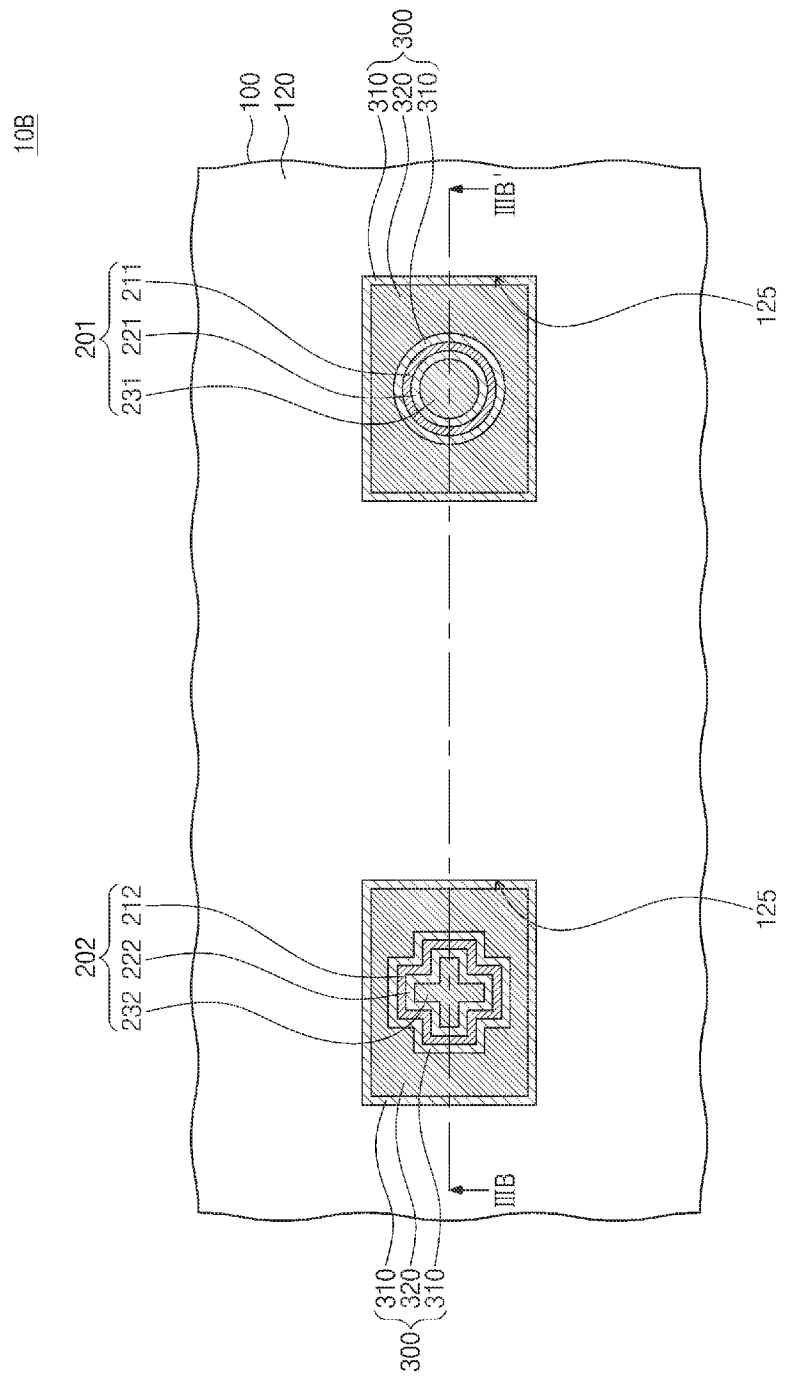
FIG. 3A is a plan view illustrating a semiconductor device according to an example embodiment of the inventive concepts.
Figure 3B:
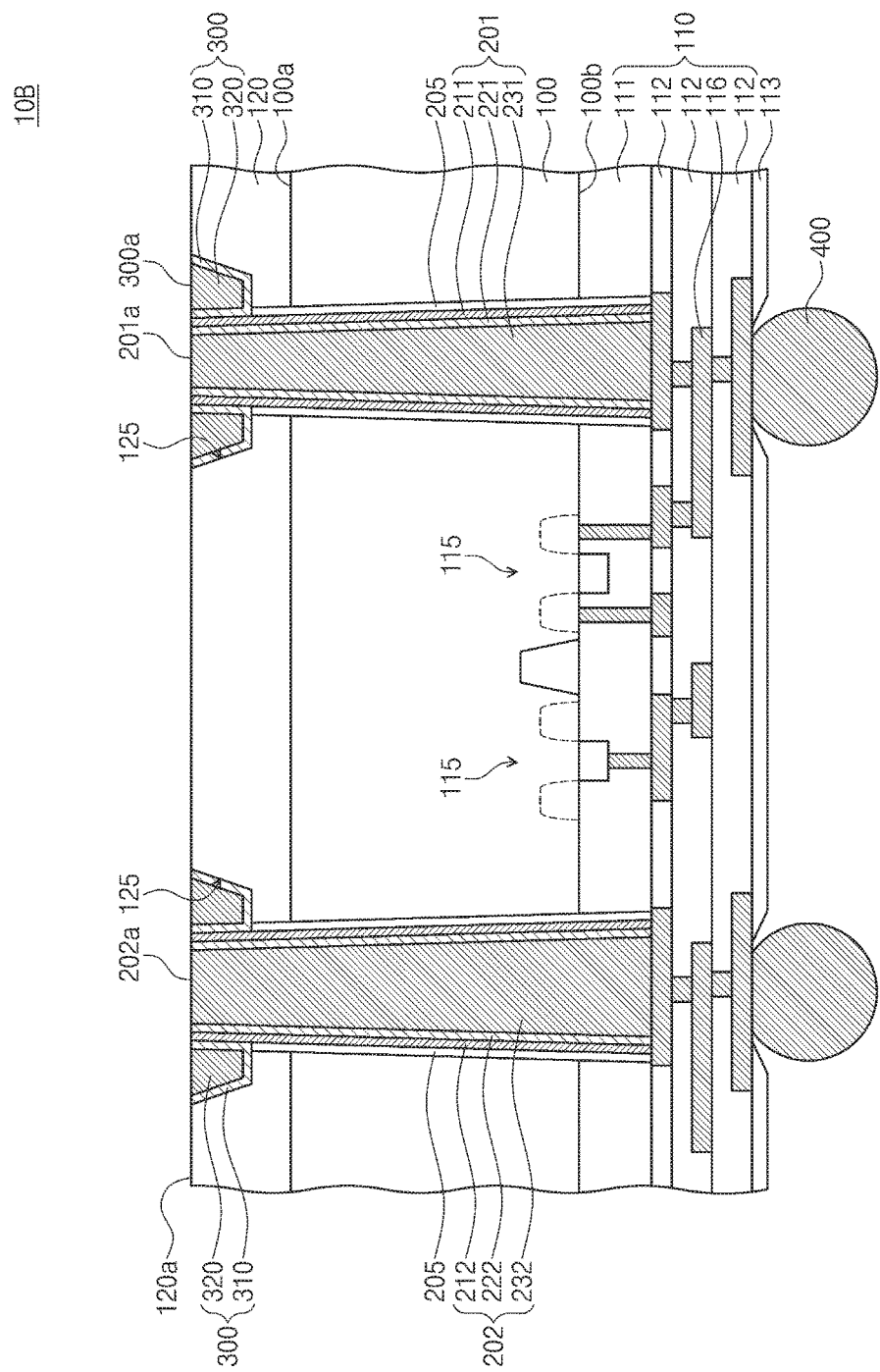
FIG. 3B is a cross-sectional view taken along a line IIIB-IIIB' of FIG. 3A.

FIG. 3A is a plan view illustrating a semiconductor device according to an example embodiment of the inventive concepts. FIG. 3B is a cross-sectional view taken along a line IIIB-IIIB' of FIG. 3A. Further, FIG. 3B corresponds to an enlarged view of a region IIIB of FIG. 1. Hereinafter, the descriptions to the same elements as in the above example embodiments will be omitted or mentioned briefly for the purpose of ease and convenience in explanation.

Referring to FIGS. 1, 3A, and 3B, a semiconductor device 10B may include a substrate 100, a circuit layer 110, an insulating layer 120, a via structure 201 and 202, and a pad structure 300. The substrate 100, the circuit layer 110, the insulating layer 120, and the pad structure 300 of FIG. 3B may be the same as or substantially similar to those described with reference to FIG. 2B. The via structure 201 and 202 may include a plurality of via structures 201 and 202, and the pad structure 300 may include a plurality of pad structures 300 respectively corresponding to the via structures 201 and 202. Each of the via structures 201 and 202 may penetrate the substrate 100, the insulating layer 120, each of the pad structures 300, and the first insulating pattern 111 of the circuit layer 110. In some example embodiments, the via structures 201 and 202 may not be provided in the first insulating pattern 111 of the circuit layer 110, like the via structure 200 of FIG. 2D.

The via structures 201 and 202 may include a first via structure 201 and a second via structure 202 which are spaced apart from each other. The first via structure 201 may be the same as or substantially similar to the via structure 200 described with reference to FIGS. 1 to 2A to 2C. The first via structure 201 may function as a connection via. For example, the first via structure 201 may be electrically connected to at least one of the transistors 115 and/or at least one of the connection terminals 400. The first via structure 201 may include a first barrier pattern 211, a first seed pattern 221, and a first conductive via 231. The second via structure 202 may include a second barrier pattern 212, a second seed pattern 222, and a second conductive via 232. The first and second barrier patterns 211 and 212 may be the same as or substantially similar to the barrier pattern 210 of FIGS. 1 and 2A to 2C, the first and second seed patterns 221 and 222 may be the same as or substantially similar to the seed pattern 220 of FIGS. 1 and 2A to 2C, and the first and second conductive vias 231 and 232 may be the same as or substantially similar to the conductive via 230 of FIGS. 1 and 2A to 2C. However, a shape of the second via structure 202 may be different from a shape of the first via structure 201. For example, as illustrated in FIG. 3A, a planar shape of the second via structure 202 may be different from a plantar shape of the first via structure 201. The second via structure 202 may function as an alignment key. Thus, an additional alignment key may not be formed on the first surface 100a of the substrate 100 or the top surface 120a of the insulating layer 120. As illustrated in FIG. 3B, the second via structure 202 may be insulated from the transistors 115. In some example embodiments, the second via structure 202 may be electrically connected to at least one of the transistors 115 through the interconnection structure 116. In this case, the second via structure 202 may function as both the alignment key and the electrical connection via.

Each of the pad structures 300 may be provided in each of trenches 125 formed in the insulating layer 120. The trench 125 may have a first width at a top surface thereof, and a second width at a bottom surface thereof such that the first width is greater than the second width. Each of the pad structures 300 may include a seed pad 310 and a conductive pad 320. One of the pad structures 300 may cover a sidewall of the first via structure 201 and may be electrically connected to the first via structure 201. Another of the pad structures 300 may cover a sidewall of the second via structure 202 and may be electrically connected to the second via structure 202. The pad structures 300 may not cover a top surface 201a of the first via structure 201 and a top surface 202a of the second via structure 202.

A method for manufacturing a semiconductor device according to some embodiments of the inventive concepts will be described hereinafter.

FIGS. 4A to 4G are cross-sectional views illustrating a method for manufacturing a semiconductor device, according to an example embodiment of the inventive concepts. Hereinafter, the descriptions to the same technical features as in the above example embodiments will be omitted or mentioned briefly for the purpose of ease and convenience in explanation. Further, a single pad structure and a single connection terminal will be described for the purpose of ease and convenience in explanation.

Figure 4A:
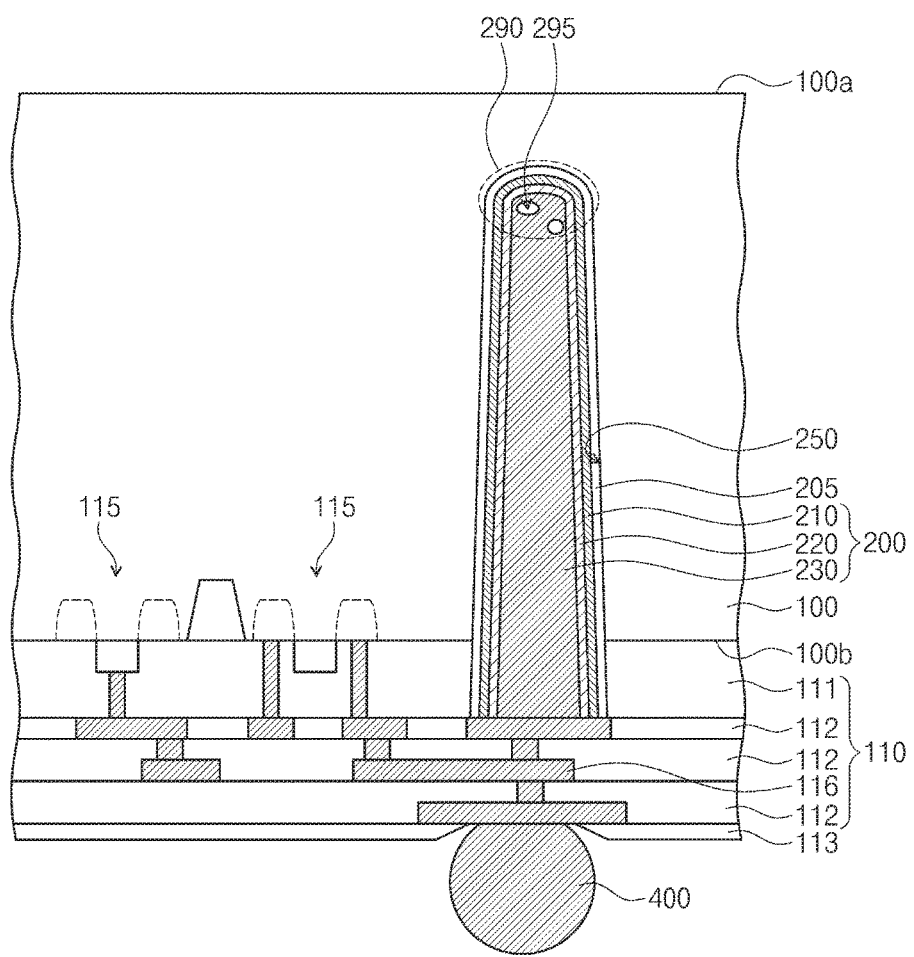
FIGS. 4A to 4G are cross-sectional views illustrating a method for manufacturing a semiconductor device, according to an example embodiment of the inventive concepts.

Referring to FIG. 4A, a circuit layer 110 may be formed on a second surface 100b of a substrate 100, and a via structure 200 may be formed in the substrate 100. In some embodiments, transistors 115 may be formed on the second surface 100b of the substrate 100. A first insulating pattern 111 may be formed on the second surface 100b of the substrate 100 to cover the transistors 115.

A via hole 250 may be formed in the substrate 100 and the first insulating pattern 111. The via hole 250 may be formed by a patterning process using an etching process. A liner layer 205 may be conformally formed on a sidewall and a bottom surface of the via hole 250. For example, the liner layer 205 may include at least one of silicon oxide, silicon nitride, or silicon oxynitride. A via structure 200 may be formed in the via hole 250. The via structure 200 may include a barrier pattern 210, a seed pattern 220, and a conductive via 230. The via structure 200 may be formed by a via-middle process. For example, the via hole 250 and the via structure 200 may be formed after the formation of the transistors 115, as illustrated in FIG. 4A. In some example embodiments, the via structure 200 may be formed by a via-first process. For example, the via hole 250 and the via structure 200 may be formed before the formation of the transistors 115 and the first insulating pattern 111. In this case, the via structure 200 may not penetrate the first insulating pattern 111, like the via structure 200 of FIG. 2D.

The barrier pattern 210 may be formed on the liner layer 205. The formation of the via structure 200 may include forming the seed pattern 220 on the barrier pattern 210 and performing an electroplating process using the seed pattern 220 as an electrode. During the electroplating process, the conductive via 230 may be formed by filling the via hole 250 with a conductive material. In the process of forming the conductive via 230, it may be difficult to completely fill the via hole 250 with the conductive material. Thus, a defect 295 (e.g., a void) may be formed in an end portion 290 of the conductive via 230. Here, the end portion 290 of the conductive via 230 may be toward a first surface 100a of the substrate 100. For example, the end portion 290 of the conductive via 230 may be adjacent to the bottom surface of the via hole 250. A gas such as air may occupy the defect 295. In some example embodiments, a residue of a chemical material used in a manufacturing process may remain in the defect 295.

Second insulating patterns 112 may be formed on the first insulating pattern 111, and an interconnection structure 116 may be formed in the first and second insulating patterns 111 and 112. Thus, the circuit layer 110 may be formed. A connection terminal 400 and a protective layer 113 may be formed on a bottom surface of the circuit layer 110.

Figure 4B:
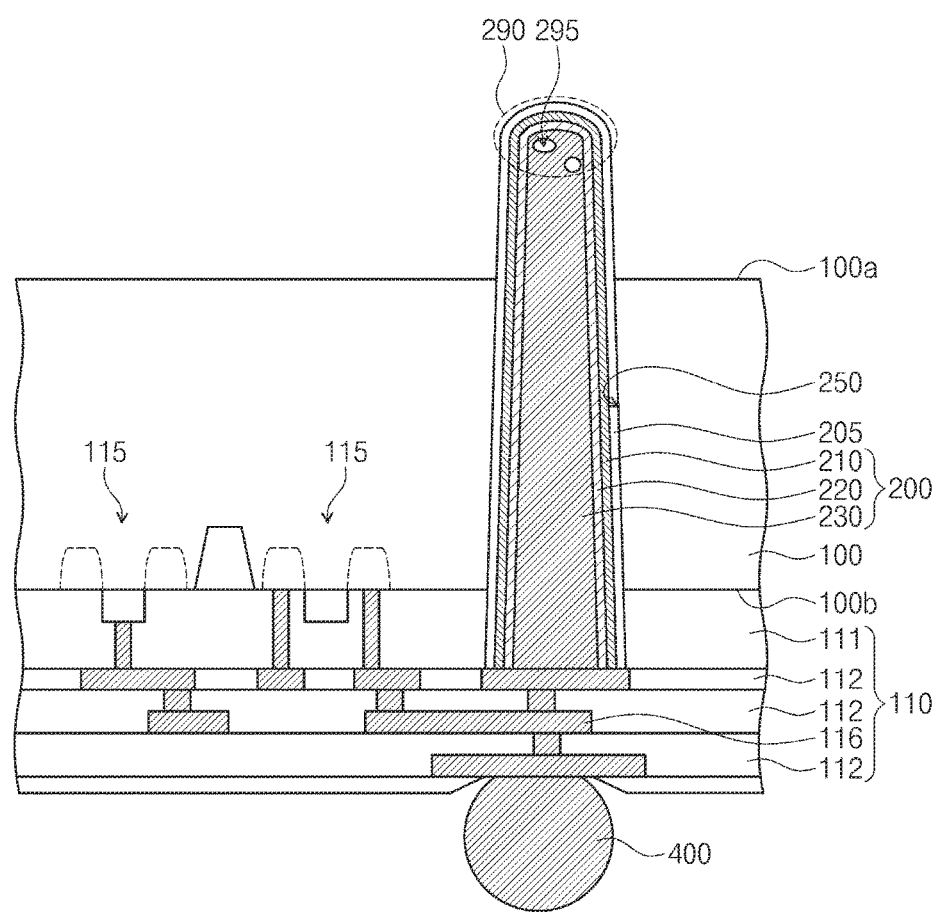

Referring to FIG. 4B, a thinning process may be performed on the first surface 100a of the substrate 100. The thinning process may be performed by an etch-back process using an etchant or slurry. The thinning process may be selectively performed on the substrate 100. The liner layer 205 and the via structure 200 may not be removed in the thinning process. The end portion 290 of the via structure 200 may protrude from the first surface 100a of the thinned substrate 100.

Figure 4C:
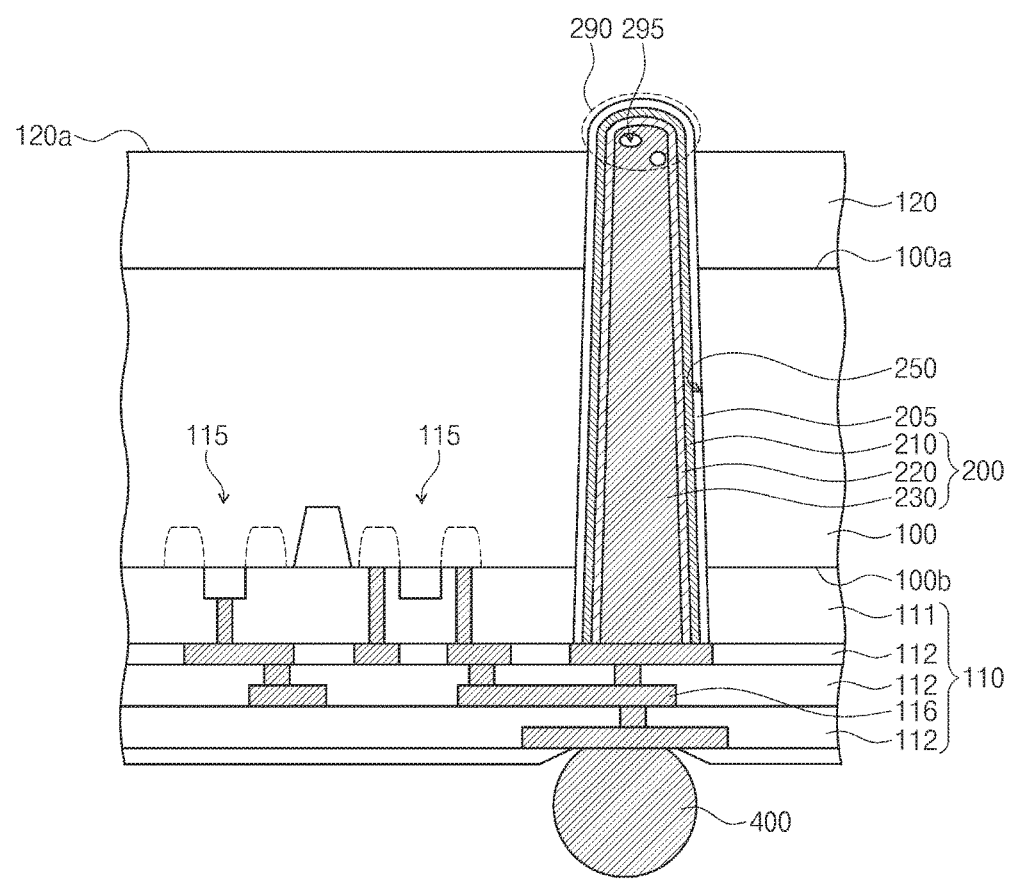

Referring to FIG. 4C, an insulating layer 120 may be formed on the first surface 100a of the thinned substrate 100. The insulating layer 120 may be formed by coating the first surface 100a of the thinned substrate 100 with, for example, a photosensitive polymer. The insulating layer 120 may include the material described with reference to FIGS. 2A to 2C.

Figure 4D:
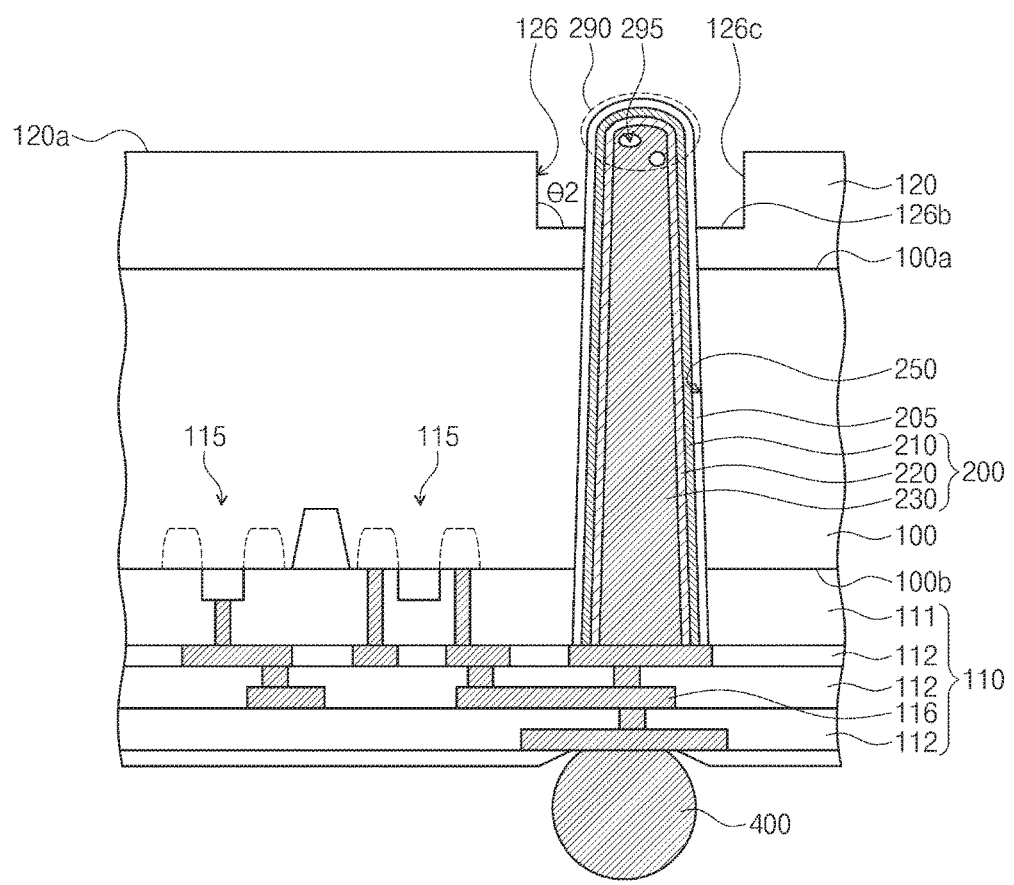

Referring to FIG. 4D, the insulating layer 120 may be patterned to form a preliminary trench 126. The preliminary trench 126 may be formed by a photolithography process using a mask pattern (not shown). The via structure 200 may be exposed by the preliminary trench 126. The end portion 290 of the via structure 200 may protrude from the preliminary trench 126. An angle 92 between a bottom surface 126b and a sidewall 126c of the preliminary trench 126 may be about 90 degrees.

Figure 4E:
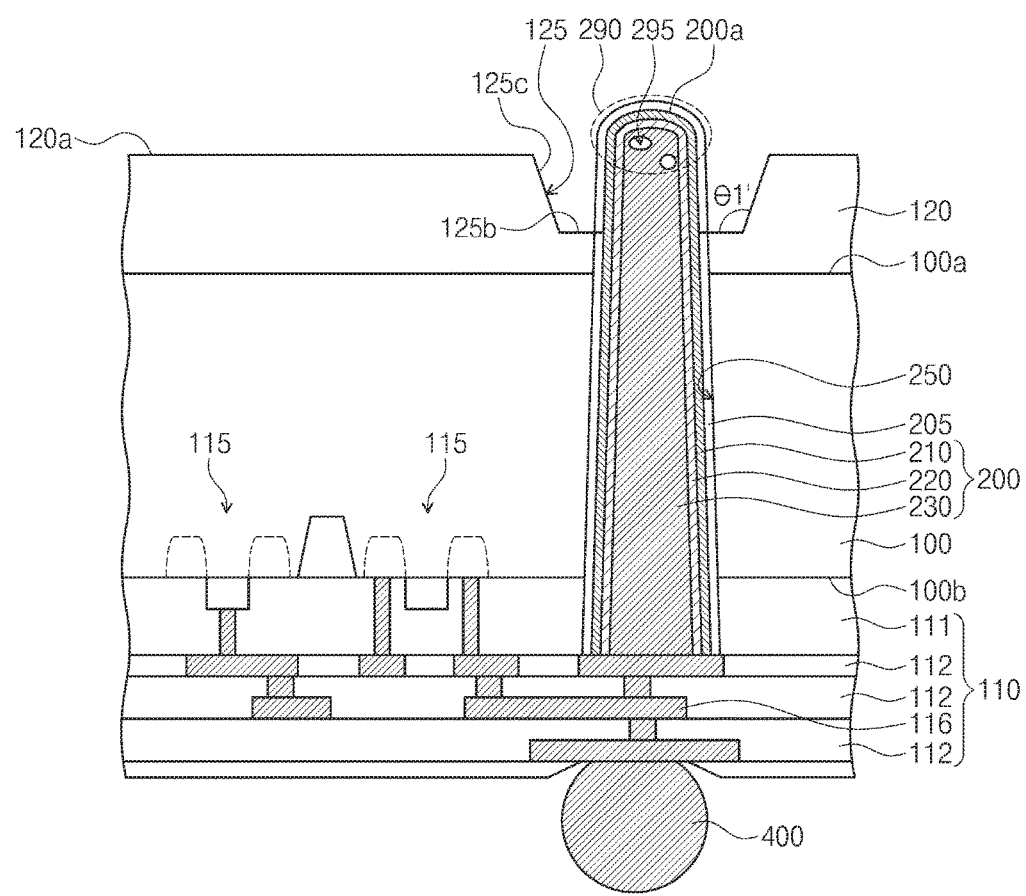

Referring to FIG. 4E, the insulating layer 120 may be hardened. In the process of hardening the insulating layer 120, a trench 125 may be formed in the insulating layer 120 such that a first width at a top surface of the trench 125 is greater than a second width at a bottom surface of the trench 125. The trench 125 may extend from a top surface 120a of the insulating layer 120 toward a bottom surface of the insulating layer 120. The insulating layer 120 may be hardened by a heat hardening process. The heat hardening process may be performed at a temperature higher than a room temperature (e.g., 25 degrees Celsius). The trench 125 may be formed by thermal flow of the preliminary trench 126. For example, a portion of the insulating layer 120 may flow down by heat in the hardening process, and thus the trench 125 may be formed. An angle θ1' between a bottom surface 125b and a sidewall 125c of the trench 125 may be different from the angle θ2 between the bottom surface 126b and the sidewall 126c of the preliminary trench 126. In some example embodiments, the angle θ1' between the bottom surface 125b and the sidewall 125c of the trench 125 may be greater than the angle θ2 between the bottom surface 126b and the sidewall 126c of the preliminary trench 126 of FIG. 4D. The angle θ1' between the bottom surface 125b and the sidewall 125c of the trench 125 may be greater than 90 degrees and equal to or less than 120 degrees. The angle θ1' between the bottom surface 125b and the sidewall 125c of the trench 125 may be substantially equal to the angle θ1 between the bottom surface 300b and the sidewall 300c of the pad structure 300 illustrated in FIG. 2C. The via structure 200 may protrude from the bottom surface 125b of the trench 125. A top surface 200a of the via structure 200 may be disposed at a higher level than the bottom surface 125b of the trench 125.

Figure 4F:
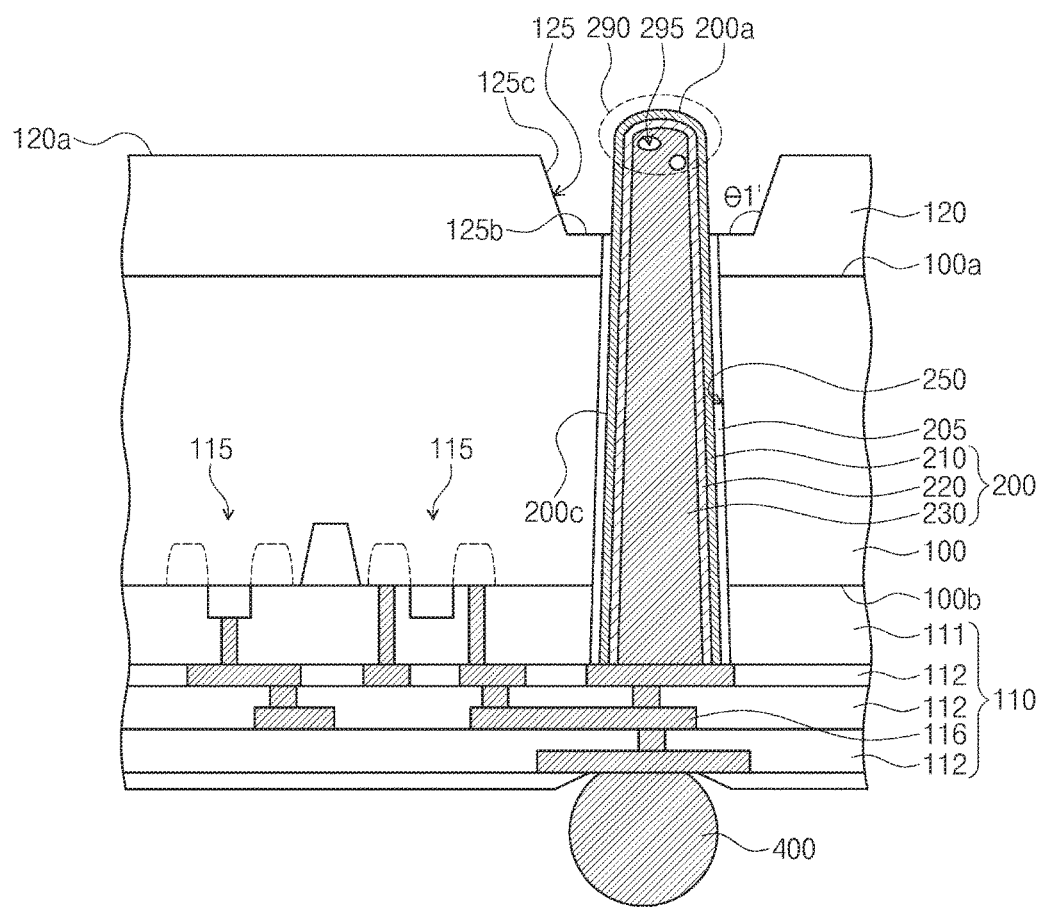

Referring to FIG. 4F, a portion of the liner layer 205 may be removed to expose an upper portion of a sidewall 200c of the via structure 200 and the top surface 200a of the via structure 200. For example, the end portion 290 of the via structure 200 may be exposed. The portion of the liner layer 205 may be removed by an etch-back process. The via structure 200 and the insulating layer 120 may have an etch selectivity with respect to the liner layer 205. The liner layer 205 disposed in the trench 125 may be removed. After the removal of the portion of the liner layer 205, the liner layer 205 may remain between the via structure 200 and the insulating layer 120 disposed under the trench 125 and between the via structure 200 and the substrate 100.

Figure 4G:
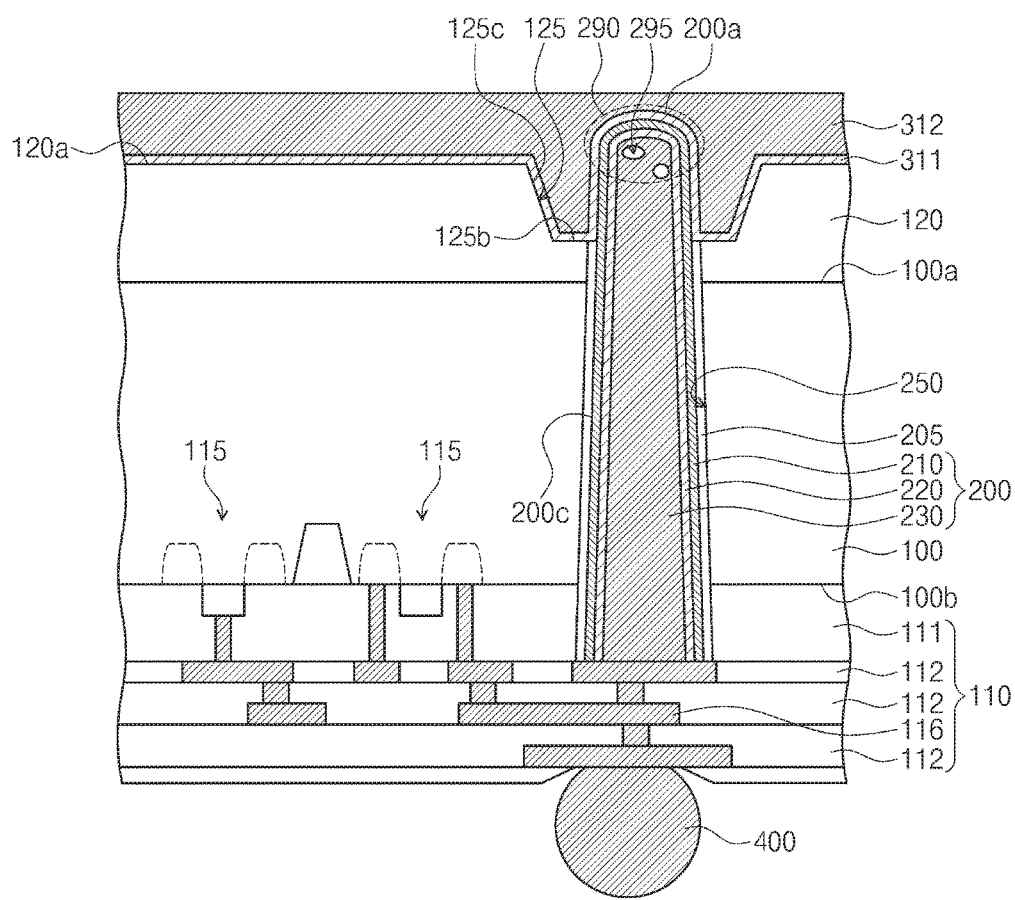

Referring to FIG. 4G, a seed layer 311 and a conductive layer 312 may be sequentially formed on the first surface 100a of the substrate 100. The seed layer 311 may be formed by a deposition process. The seed layer 311 may extend along the top surface 120a of the insulating layer 120, the bottom surface 125b and the sidewall 125c of the trench 125, the upper portion of the sidewall 200c of the via structure 200, and the top surface 200a of the via structure 200. The seed layer 311 may be in contact with the barrier pattern 210. The conductive layer 312 may be formed on the seed layer 311. The conductive layer 312 may be formed by an electroplating process using the seed layer 311 as an electrode. The conductive layer 312 may fill the trench 125.

Referring again to FIG. 4G, the seed layer 311 and the conductive layer 312 may be planarized to form a seed pad 310 and a conductive pad 320. The seed pad 310 and the conductive pad 320 may be formed in the trench 125. Thus, a pad structure 300 including the seed pad 310 and the conductive pad 320 may be provided. The planarization process may be performed using a chemical mechanical polishing (CMP) process. The seed layer 311 and the conductive layer 312 disposed on the top surface 120a of the insulating layer 120 may be removed by the planarization process. The insulating layer 120 may be planarized together with the seed layer 311 and the conductive layer 312. The top surface 120a of the insulating layer 120 may be exposed. The pad structure 300 may be confined in the trench 125. A top surface 300a of the pad structure 300 may be substantially coplanar with the top surface 120a of the insulating layer 120.

The via structure 200 may be planarized together with the seed layer 311 and the conductive layer 312, and thus a portion of the via structure 200 may be removed. For example, the end portion 290 of the via structure 200 may be removed. At this time, the defect 295 may be removed together with the end portion 290 of the via structure 200. Thus, electrical characteristics and reliability of the via structure 200 may be improved. After the planarization process, the via structure 200 may be exposed by the pad structure 300. The top surface 200a of the planarized via structure 200 may be substantially coplanar with the top surface 300a of the pad structure 300 and the top surface 120a of the insulating layer 120. Thus, the semiconductor device 10 of FIG. 2B may be manufactured.

Figure 4H:
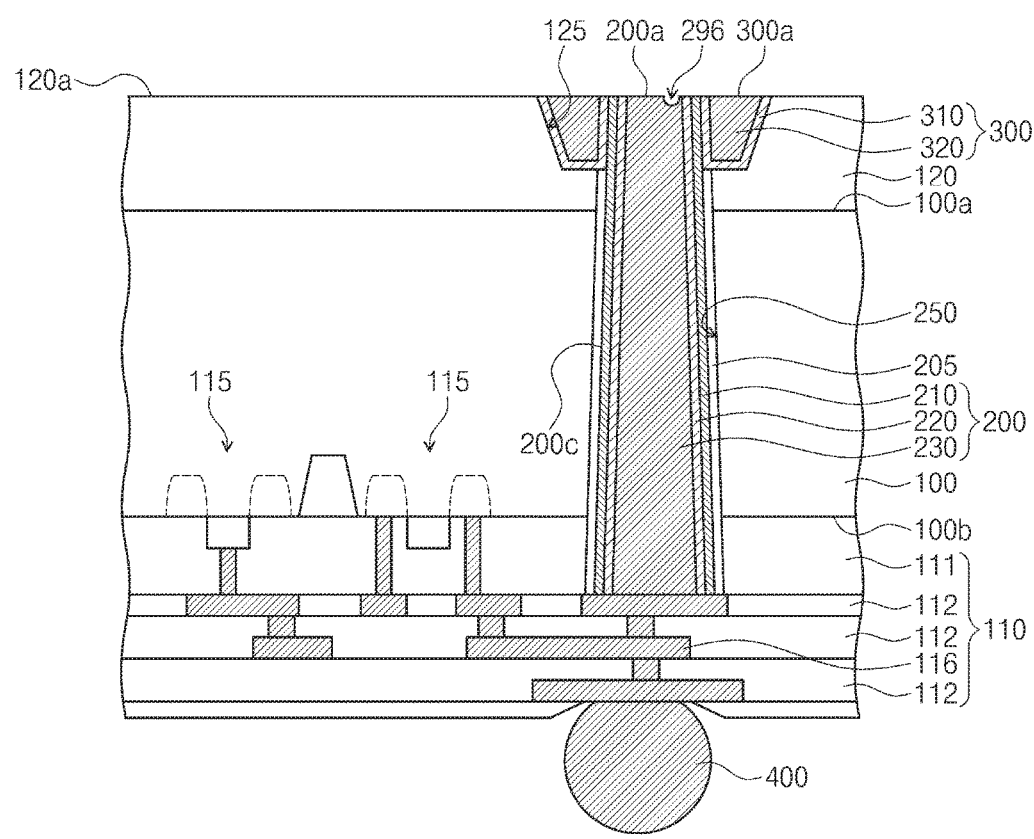
FIG. 4H is a cross-sectional view taken along the line IIB-IIB' of FIG. 2A to explain an additional planarization process according to an example embodiment of the inventive concepts.

FIG. 4H is a cross-sectional view taken along the line of FIG. 2A to explain an additional planarization process according to an example embodiment of the inventive concepts. Hereinafter, the descriptions to the same elements as in the above embodiments will be omitted or mentioned briefly for the purpose of ease and convenience in explanation.

Referring to FIGS. 4G and 4H, the substrate 100 including the circuit layer 110, the via structure 200, the insulating layer 120, the seed layer 311, and the conductive layer 312 may be prepared. The seed layer 311 and the conductive layer 312 may be formed as illustrated in FIG. 4G. The conductive layer 312, the seed layer 311, and the insulating layer 120 may be planarized to form the pad structure 300 as illustrated in FIG. 4H. A portion of the via structure 200 may be removed by the planarization process. After the planarization process, the defect 295 of the end portion 290 of the via structure 200 may remain to form a residual defect 296 as illustrated in FIG. 4H. The residual defect 296 may be a recessed portion of the top surface 200a of the planarized via structure 200. The residual defect 296 may be inspected. For example, the inspection of the residual defect may be performed by measuring a flatness of the top surface 200a of the via structure 200. The residual defect 296 may be easily inspected because the top surface 200a of the via structure 200 is exposed. When the residual defect 296 is detected, an additional planarization process may be performed.

Referring to FIGS. 4H and 2B, the residual defect 296 may be removed from the top surface 200a of the via structure 200 by the additional planarization process. The inspection of the residual defect 296 and the additional planarization process may be repeated. The additional planarization process may be performed until the residual defect 296 is not detected, and thus the top surface 200a of the via structure 200 is substantially flat. Thus, the electrical characteristics and reliability of the via structure 200 may be improved. Here, the terms 'substantially flat top surface' may take into account a tolerance range that may occur in the planarization process.

Figure 5A:
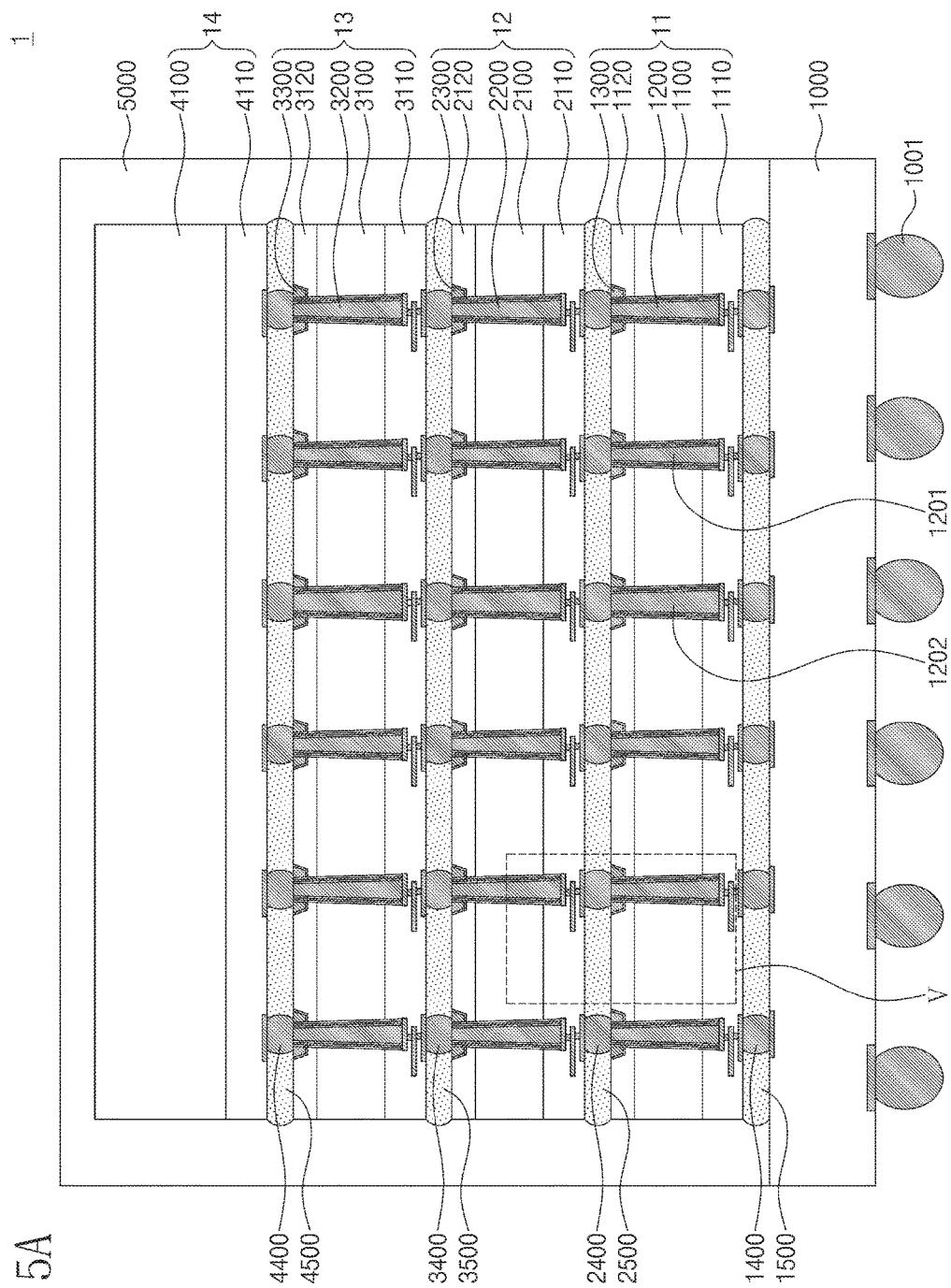
FIG. 5A is a cross-sectional view illustrating a semiconductor package according to an example embodiment of the inventive concepts.
Figure 5B:
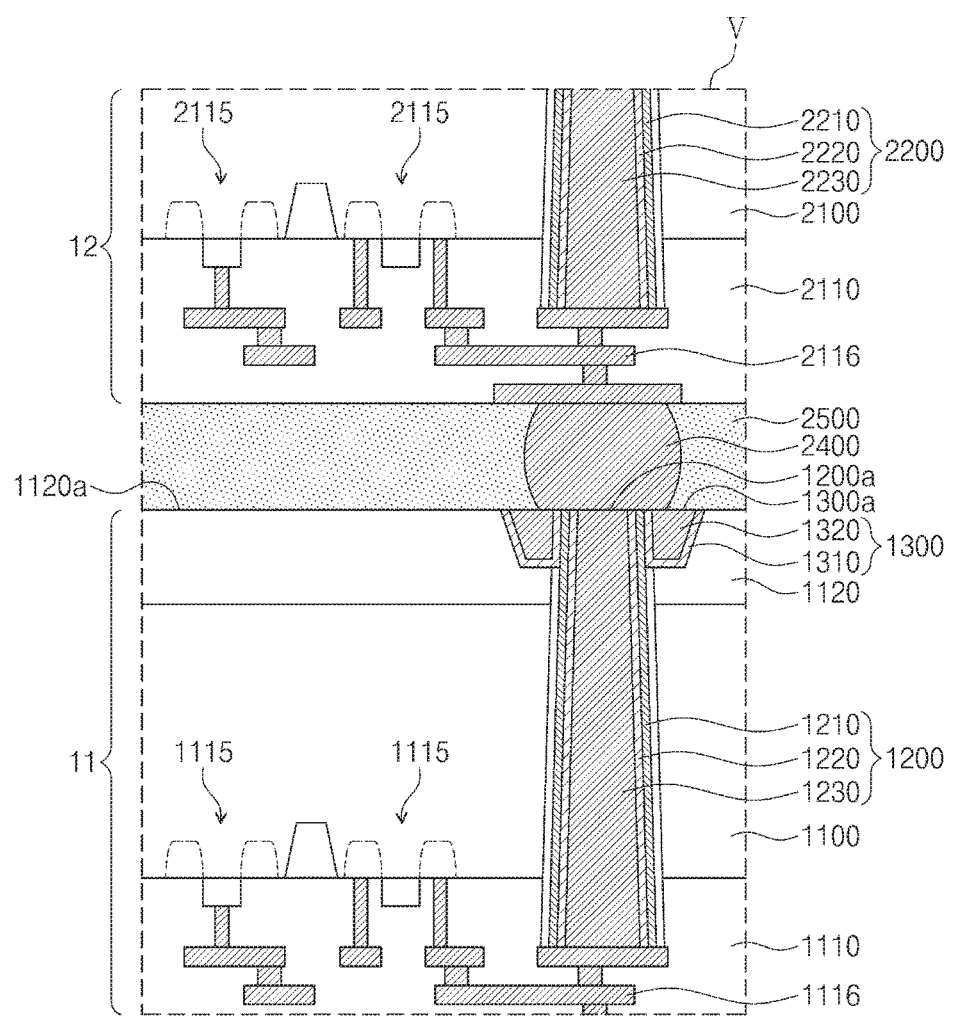
FIG. 5B is an enlarged view of a region VB of FIG. 5A.

FIG. 5A is a cross-sectional view illustrating a semiconductor package according to an example embodiment of the inventive concepts. FIG. 5B is an enlarged view of a region VB of FIG. 5A. Hereinafter, the descriptions to the same elements as in the above embodiments will be omitted or mentioned briefly for the purpose of ease and convenience in explanation.

Referring to FIGS. 5A and 5B, a semiconductor package 1 may include a package substrate 1000, first to fourth semiconductor devices 11, 12, 13, and 14, and a molding layer 5000. The package substrate 1000 may include a printed circuit board (PCB) or a redistribution layer. External terminals 1001 may be disposed on a bottom surface of the package substrate 1000. Each of the first to third semiconductor devices 11, 12, and 13 may be the same as the semiconductor device 10 of FIGS. 2A to 2C, the semiconductor device 10A of FIG. 2D, or the semiconductor device 10B of FIGS. 3A and 3B. The first, second and third semiconductor devices 11, 12 and 13 may include first, second, and third substrates 1100, 2100, and 3100, first, second, and third circuit layers 1110, 2110, and 3110, first, second, and third insulating layers 1120, 2120, and 3120, first, second, and third via structures 1200, 2200, and 3200, and first, second, and third pad structures 1300, 2300, and 3300, respectively. The fourth semiconductor device 14 may be the uppermost semiconductor device. The fourth semiconductor device 14 may include a fourth substrate 4100 and a fourth circuit layer 4110, but may not include a via structure and a pad structure. However, example embodiments of the inventive concepts are not limited to the number of the semiconductor devices 11 to 14 included in the semiconductor package 1.

The first semiconductor device 11 may be mounted on the package substrate 1000. The first semiconductor device 11 may be electrically connected to the package substrate 1000 through first connection terminals 1400. The first semiconductor device 11 may be electrically connected to the external terminals 1001 through the package substrate 1000. A first adhesive film 1500 may be disposed between the first semiconductor device 11 and the package substrate 1000 to seal or cover the first connection terminals 1400. The first adhesive film 1500 may include an insulating material. The second semiconductor device 12 may be mounted on the first semiconductor device 11. Second connection terminals 2400 may be provided between the first semiconductor device 11 and the second semiconductor device 12.

The second connection terminals 2400 may be the connection terminals 400 described with reference to FIGS. 2A and 2B, FIG. 2D, FIGS. 3A and 3B, or FIG. 4B. For example, the second connection terminals 2400 may be disposed on a bottom surface of the second circuit layer 2110. The second connection terminals 2400 may include at least one of tin, lead, silver, or any alloy thereof. The second semiconductor device 12 may be disposed on the first semiconductor device 11 in such a way that the second connection terminals 2400 face the first semiconductor device 11. In some example embodiments, the first via structures 1200 may include a first via structure 1201 and a second via structure 1202. The first via structure 1201 and the second via structure 1202 may be the same as the first via structure 201 and the second via structure 202 described with reference to FIGS. 3A and 3B, respectively. For example, the second via structure 1202 may function as an alignment key. The second semiconductor device 12 may be aligned with the first semiconductor device 11 by using the second via structure 1202. In this case, an additional alignment key may not be formed on the first substrate 1100. In some example embodiments, an alignment key (not shown) may be separately provided on the first insulating layer 1120 or the first substrate 1100. In this case, the second semiconductor device 12 may be aligned with the first semiconductor device 11 by using the alignment key (not shown). In this case, the second via structure 1202 may be omitted. Hereinafter, electrical connection between the first and second semiconductor devices 11 and 12 will be described in more detail with reference to FIG. 5B.

The second connection terminal 2400 may be electrically connected to at least one of second transistors 2115 or the second via structure 2200 of the second semiconductor device 12 through a second interconnection structure 2116 of the second circuit layer 2110. The first pad structure 1300 and the first via structure 1200 may be exposed at a top surface of the first semiconductor device 11. The second connection terminal 2400 may be in direct contact with the first via structure 1200 and the first pad structure 1300 through a reflow process. The second connection terminal 2400 may be electrically connected to at least one of first transistors 1115 of the first semiconductor device 11 through the first via structure 1200, the first pad structure 1300, and a first interconnection structure 1116 of the first circuit layer 1110. The second connection terminal 2400 may be electrically connected to the package substrate 1000 through the first via structure 1200. Thus, the second semiconductor device 12 may be electrically connected to the first semiconductor device 11 and the package substrate 1000.

A second adhesive film 2500 may be disposed between the first semiconductor device 11 and the second semiconductor device 12. The second adhesive film 2500 may surround the second connection terminal 2400. The second adhesive film 2500 may include an insulating material. For example, the second adhesive film 2500 may include at least one of an epoxy-based polymer, polyimide, polyester, an acrylic polymer, or polysulfone. The second adhesive film 2500 may not include conductive particles. If the top surface of the first semiconductor device 11 is not substantially flat, it may be difficult to seal the second connection terminal 2400 by the second adhesive film 2500. For example, a cavity (not shown) may be formed between the first semiconductor device 11 and the second semiconductor device 12. A defect may occur in the semiconductor package 1 by the cavity. However, according to some example embodiments of the inventive concepts, the top surface of the first semiconductor device 11 may be substantially flat. For example, a top surface 1200a of the first via structure 1200 may be disposed at the same level as or substantially similar level to a top surface 1300a of the first pad structure 1300 and a top surface 1120a of the first insulating layer 1120. Thus, the second adhesive film 2500 may seal the second connection terminal 2400 well. Accordingly, the cavity may be inhibited or prevented from being formed between the first semiconductor device 11 and the second semiconductor device 12. Accordingly, a yield of the semiconductor package 1 may be improved.

The first and second via structures 1200 and 2200 may include first and second barrier patterns 1210 and 2210, first and second seed patterns 1220 and 2220, and first and second conductive vias 1230 and 2230, respectively. The first and second pad structures 1300 and 2300 may include first and second seed pads 1310 and 2310 and first and second conductive pads 1320 and 2320, respectively.

As illustrated in FIG. 5A, a top surface of the second via structure 2200 may be substantially coplanar with a top surface of the second pad structure 2300 and a top surface of the second insulating layer 2120. A third connection terminal 3400 may be in direct contact with the second via structure 2200 and the second pad structure 2300. A third adhesive film 3500 may be disposed on the top surface of the second insulating layer 2120 to seal the third connection terminal 3400. A top surface of the third via structure 3200 may be substantially coplanar with a top surface of the third pad structure 3300 and a top surface of the third insulating layer 3120. A fourth connection terminal 4400 may be in direct contact with the third via structure 3200 and the third pad structure 3300. A fourth adhesive film 4500 may be disposed on the top surface of the third insulating layer 3120 to seal the fourth connection terminal 4400. Each of the third and fourth adhesive films 3500 and 4500 may include at least one of the materials described as the examples of the second adhesive film 2500. The molding layer 5000 may be provided on the package substrate 1000 to cover the first to fourth semiconductor devices 11, 12, 13, and 14.

According to some example embodiments of the inventive concepts, the top surface of the via structure and the top surface of the pad structure may be exposed at the top surface of the semiconductor device. The connection terminal may be in contact with the via structure and the pad structure. The top surface of the via structure may be substantially coplanar with the top surface of the pad structure and the top surface of the insulating layer. Thus, the adhesive film may be disposed on the top surface of the insulating layer to seal the connection terminal.

The insulating layer may buffer or reduce the stress applied to the pad structure. The pad structure may be embedded in the insulating layer to improve the adhesive strength between the pad structure and the insulating layer. The angle between the bottom surface and the sidewall of the pad structure may be adjusted, and thus the stress may not be concentrated in the edge or corner of the pad structure. Thus, reliability of the semiconductor device may be improved.

While the inventive concepts have been described with reference to example embodiments, it will be apparent to those skilled in the art that various changes and modifications may be made without departing from the spirits and scopes of the disclosed example embodiments. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a substrate;
   an insulating layer on the substrate, the insulating layer including a trench;
   at least one via structure penetrating the substrate and protruding above a bottom surface of the trench; and
   a conductive structure surrounding the at least one via structure in the trench,
   wherein a first portion of a top surface of the insulating layer that is outside the trench, the at least one via structure, and the conductive structure are substantially coplanar.

2. The semiconductor device of claim 1, wherein the top surface of the insulating layer further includes a second portion at a bottom of the trench, and a third portion connecting the first and second portions, the first portion defines a top of the trench, and the second portion is vertically between the first portion and a bottom surface of the insulating layer.

3. The semiconductor device of claim 1, wherein the trench has a first width at a top thereof and a second width at a bottom thereof, and the first width is larger than the second width.

4. The semiconductor device of claim 1, wherein the at least one via structure and the conductive structure comprise a same metal material.

5. The semiconductor device of claim 1, further comprising:
   a barrier pattern along a first sidewall of the trench, the bottom surface of the trench, and a second sidewall of the trench, the first sidewall being a sidewall between the at least one via structure and the conductive structure, and the second sidewall being a sidewall of the trench between the conductive structure and the insulating layer.

6. The semiconductor device of claim 5, wherein the at least one via structure and the conductive structure comprise different metal materials from each other.

7. The semiconductor device of claim 1, wherein the insulating layer has a thermal expansion coefficient greater that a thermal expansion coefficient of the substrate.

8. The semiconductor device of claim 7, wherein the insulating layer includes at least one of an organic insulating layer or a polymer.

9. The semiconductor device of claim 1, wherein the at least one via structure includes a connection via structure and an alignment via structure, the alignment via structure is spaced apart from the connection via structure, and the alignment via structure serves as an alignment key.

10. The semiconductor device of claim 1, wherein the conductive structure serves as one of a bonding pad or a redistribution layer.

11. A semiconductor device comprising:
    a substrate;
    an insulating layer on the substrate, the insulating layer defining a trench, the insulating layer having a first top surface outside the trench, a second top surface at a bottom of the trench, and a third top surface connecting the first and second top surfaces, the trench extending from the first top surface of the insulating layer to a point vertically between the first top surface of the insulating layer and a bottom surface of the insulating layer;
at least one conductive via structure penetrating the substrate and protruding above the bottom of the trench; and
at least one conductive structure surrounding the at least one conductive via structure in the trench,
wherein the first top surface of the insulating layer, a top surface of the at least one conductive via structure, and a top surface of the at least one conductive structure are substantially coplanar.

12. The semiconductor device of claim 11, wherein the trench has a first width at a top thereof and a second width at the bottom thereof, and the first width is larger than the second width.

13. The semiconductor device of claim 11, further comprising:
a barrier pattern along a first sidewall of the trench, the bottom of the trench, and a second sidewall of the trench, the first sidewall being a sidewall between the at least one via structure and the at least one conductive structure, and the second sidewall being a sidewall of the trench between the at least one conductive structure and the insulating layer.

14. The semiconductor device of claim 11, wherein the insulating layer has a thermal expansion coefficient greater that a thermal expansion coefficient of the substrate.

15. A semiconductor device, when viewed in a plan view, comprising:
a first metal structure including a first metal material;
a barrier metal pattern surrounding the first metal structure; and
a conductive structure surrounding the barrier metal pattern, the conductive structure including a second metal material; and
an insulating layer surrounding the conductive structure.

16. The semiconductor device of claim 15, further comprising:
a seed pattern for the first metal structure along an inner sidewall of the barrier metal pattern.

17. The semiconductor device of claim 15, further comprising:
a seed pattern for the conductive structure along an outer sidewall of the barrier metal pattern.

18. The semiconductor device of claim 15, wherein the first metal material and the second metal material is a same material.

* * * * *